United States Patent
Chan et al.

(10) Patent No.: US 7,023,059 B1
(45) Date of Patent: Apr. 4, 2006

(54) TRENCHES TO REDUCE LATERAL SILICIDE GROWTH IN INTEGRATED CIRCUIT TECHNOLOGY

(75) Inventors: Darin A. Chan, San Francisco, CA (US); Simon Siu-Sing Chan, Saratoga, CA (US); Jeffrey P. Patton, Santa Clara, CA (US); Jacques J. Bertrand, Capitola, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/791,094

(22) Filed: Mar. 1, 2004

(51) Int. Cl.
*H01L 29/94* (2006.01)

(52) U.S. Cl. .................. 257/382; 257/213; 257/288; 257/368; 257/386; 257/387; 257/388; 438/584; 438/597; 438/682; 438/683

(58) Field of Classification Search ............ 257/377, 257/382, 383, 384, 387, 388, 412, 413, 768, 257/767, 765, 769, 720; 438/302, 297, 292, 438/588, 587, 585
See application file for complete search history.

(56) References Cited

U.S. PATENT DOCUMENTS

| 5,027,185 | A * | 6/1991 | Liauh |
| 5,648,175 | A * | 7/1997 | Russell et al. |
| 5,665,990 | A * | 9/1997 | Kang et al. |
| 5,918,141 | A * | 6/1999 | Merrill |
| 6,333,255 | B1 * | 12/2001 | Sekiguchi |
| 6,518,155 | B1 * | 2/2003 | Chau et al. |
| 6,580,143 | B1 * | 6/2003 | Yoshida et al. |
| 6,770,942 | B1 * | 8/2004 | Iinuma |

* cited by examiner

*Primary Examiner*—Nathan J. Flynn
*Assistant Examiner*—Kevin Quinto
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. Source/drain junctions are formed in the semiconductor substrate. A silicide is formed on the source/drain regions and on the gate. Trenches are formed in the semiconductor substrate around the gate. An interlayer dielectric is deposited above the semiconductor substrate, and contacts are then formed to the silicide.

8 Claims, 4 Drawing Sheets

1300

```
┌─────────────────────────────────────────────┐
│   PROVIDING A SEMICONDUCTOR SUBSTRATE       │
│                   1302                      │
└─────────────────────────────────────────────┘
                      │
┌─────────────────────────────────────────────┐
│  FORMING A GATE DIELECTRIC ON THE SEMICONDUCTOR │
│                  SUBSTRATE                  │
│                   1304                      │
└─────────────────────────────────────────────┘
                      │
┌─────────────────────────────────────────────┐
│      FORMING A GATE ON THE GATE DIELECTRIC  │
│                   1306                      │
└─────────────────────────────────────────────┘
                      │
┌─────────────────────────────────────────────┐
│  FORMING SOURCE/DRAIN JUNCTIONS IN THE SEMICONDUCTOR │
│                  SUBSTRATE                  │
│                   1308                      │
└─────────────────────────────────────────────┘
                      │
┌─────────────────────────────────────────────┐
│  FORMING A SILICIDE ON THE SOURCE/DRAIN JUNCTIONS AND ON │
│                  THE GATE                   │
│                   1310                      │
└─────────────────────────────────────────────┘
                      │
┌─────────────────────────────────────────────┐
│   FORMING TRENCHES IN THE SEMICONDUCTOR SUBSTRATE │
│               AROUND THE GATE               │
│                   1312                      │
└─────────────────────────────────────────────┘
                      │
┌─────────────────────────────────────────────┐
│   DEPOSITING AN INTERLAYER DIELECTRIC ABOVE THE │
│           SEMICONDUCTOR SUBSTRATE           │
│                   1314                      │
└─────────────────────────────────────────────┘
                      │
┌─────────────────────────────────────────────┐
│  FORMING CONTACTS IN THE INTERLAYER DIELECTRIC TO THE │
│                  SILICIDE                   │
│                   1316                      │
└─────────────────────────────────────────────┘
```

FIG. 13

TRENCHES TO REDUCE LATERAL SILICIDE GROWTH IN INTEGRATED CIRCUIT TECHNOLOGY

BACKGROUND

1. Technical Field

The present invention relates generally to semiconductor technology, and more specifically to siliciding in semiconductor devices.

2. Background Art

Electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor (CMOS) transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions," which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions."

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the source/drain junctions and to the polysilicon gates. The contact openings are then filled with a conductive metal and interconnected by formation of conductive wires in other interlayer dielectric (ILD) layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by first applying a thin layer of the cobalt or titanium on the silicon substrate above the source/drain junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding." Since the shallow trench oxide and the sidewall spacers will not react to form a silicide, the silicides are aligned over the source/drain junctions and the polysilicon gates so the process is also referred to as "self-aligned siliciding," or "saliciding."

However, existing siliciding and saliciding have not succeeded in solving all the problems related to connecting metal contacts to silicon.

The problems include, but are not limited to, lateral growth of the silicide under the sidewall spacer causing increased transistor leakage current and, in some cases, short circuits in the transistors.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. Source/drain junctions are formed in the semiconductor substrate. A silicide is formed on the source/drain junctions and on the gate. Trenches are formed in the semiconductor substrate around the gate. An interlayer dielectric is deposited above the semiconductor substrate, and contacts are then formed in the interlayer dielectric to the silicide.

This method significantly lowers the electrical resistance between the contacts and the silicon or polysilicon greatly improving performance of the integrated circuit.

The present invention also reduces the lateral growth of the silicide under the gate thereby reducing transistor leakage current and electrical short circuits.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 13 is a simplified flow chart of the method of manufacturing the silicide in accordance with the present invention.

DETAILED DESCRIPTION OF THE INVENTION

Figure 1:
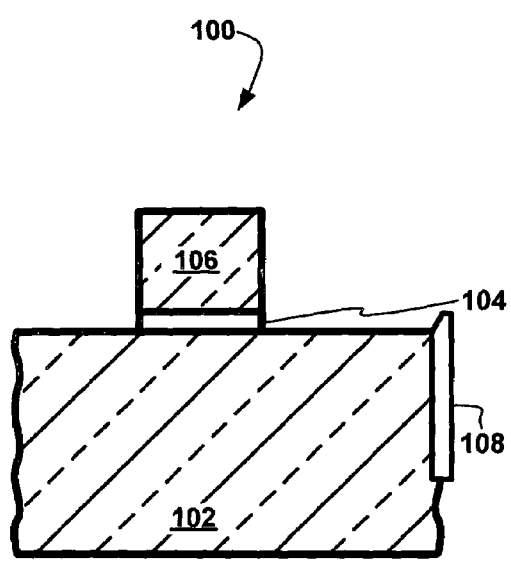
FIG. 1 is a view of a transistor in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a transistor 100 in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation (STI) 108.

Figure 2:
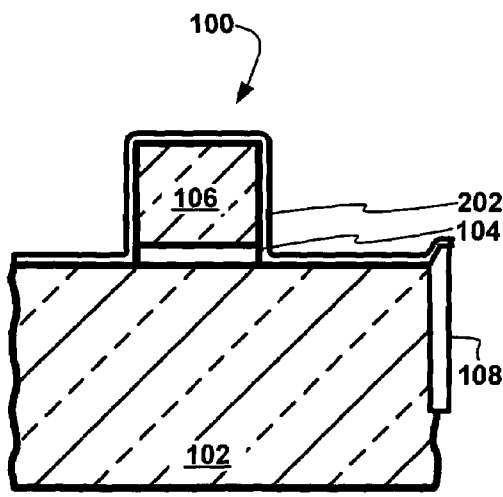
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
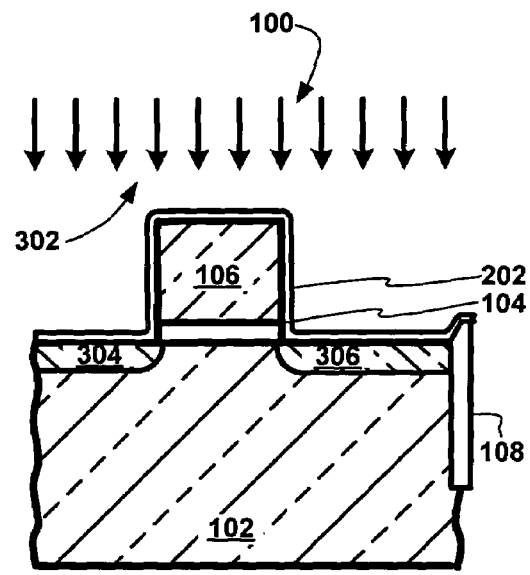
FIG. 3 is the structure of FIG. 2 during ion implantation to form shallow source/drain junctions.

Referring now to FIG. 3, therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow source/drain junctions 304 and 306.

Figure 4:
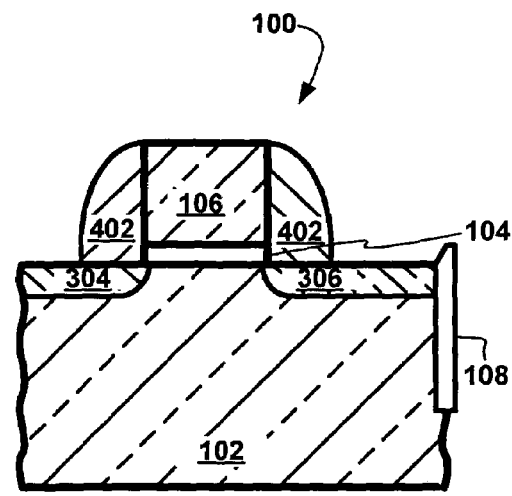
FIG. 4 is the structure of FIG. 3 after formation of a sidewall spacer.

Referring now to FIG. 4, therein is shown the structure of FIG. 3 after formation of a curved sidewall spacer 402.

The liner layer 202, which protects from implant damage, has been removed and a sidewall spacer layer, generally of silicon nitride, has been deposited and etched to form the curved shape of the sidewall spacer 402.

Figure 5:
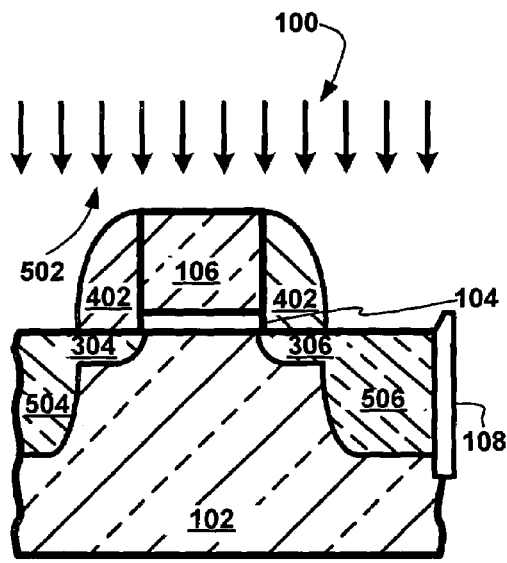
FIG. 5 is the structure of FIG. 4 during ion implantation to form deep source/drain junctions.

Referring now to FIG. 5, therein is shown the structure of FIG. 4 during an ion implantation 502 to form deep source/drain junctions 504 and 506.

The sidewall spacer 402, the gate 106, and the STI 108, act as masks for the formation of the deep source/drain junctions 504 and 506 by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the source/drain junctions 504 and 506.

Figure 6:
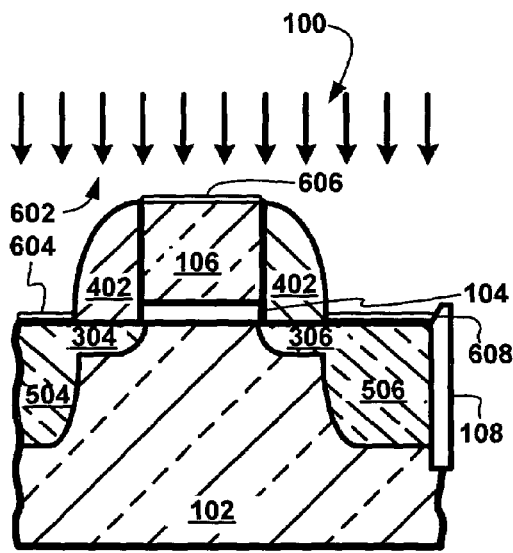
FIG. 6 is the structure of FIG. 5 during the formation of silicide.

Referring now to FIG. 6, therein is shown a deposition process 602 used in the formation of silicide layers 604, 606, and 608 in accordance with the present invention. The silicide layers 604 and 608 are formed with the surface of the semiconductor substrate 102 over the deep source/drain junctions 504 and 506, respectively, and the silicide 606 is formed on the gate 106.

The silicide 604, 606, 608 preferably is formed of a metal selected from the group consisting of cobalt, titanium, nickel, arsenic doped nickel, an alloy thereof, a compound thereof, and a combination thereof.

Generally, there are three ways in which to form a silicide. In one technique, the deposition process 602 deposits a pure metal on exposed silicon areas (both single crystalline and polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. In a second technique, the deposition process 602 involves co-evaporation of both metal and silicon onto the exposed silicon. Both metal and silicon are vaporized by, for example, an electron beam. The vapor is then drawn onto the wafer and across the silicon. In a third technique, the deposition process 602 involves co-sputtering both metal and silicon onto the silicon surface. Co-sputtering entails physically dislodging metal and silicon materials from a composite target or separate targets, and then directing the composite material onto the wafer.

Conventional salicidation processes have become problematic with modern semiconductor devices that have shallow source/drain junctions, e.g., junction depths on the order of 1000 Angstroms (Å). In particular, during such salicidation processes, some of the existing source/drain regions are consumed.

When cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

When the refractory metal is titanium, titanium silicide forms between metal contacts because the sidewall spacer becomes smaller with smaller integrated circuits thereby allowing a capacitive-coupled or fully conductive path between the polysilicon gate and the source/drain junctions, and similarly, degrades the performance of the integrated circuit.

While the present invention may be used with various refractory metal suicides, it has been found that nickel silicide has many desirable characteristics. However, in working with nickel silicide, it has been found to be difficult to form robust nickel. It has been thought that thick suicides around 100 Å thick with rough surfaces would best protect the silicon substrate and provide good adhesion.

However, an ultra-uniform nickel silicide can form extremely robust nickel silicide. By definition, an ultra-uniform silicide means a layer of silicide where there are no variations in thickness greater than about 3% of the overall thickness.

One example of forming ultra-uniform nickel ultra-uniform silicides 604, 606, and 608, is by depositing the nickel on the exposed silicon areas by a very low power vapor deposition process, where the very low power means a power level below 500 watts direct current and preferably between about 400 and 300 watts direct current.

In addition, an extra slow rate of metal deposition is preferred, which is defined to be below 7.0 Å per second and preferably between about 6.8 and 6.0 Å per second.

Still further, it is preferable that the silicide be deposited under these power levels and deposition rates to an ultra-thin thickness of not more than 50 Å thickness in order to provide an ultra-uniform, ultra-thin silicide. The deposited silicide metal is then converted to a silicide by an annealing process, such as a high-temperature anneal around 700° C.

Figure 7:
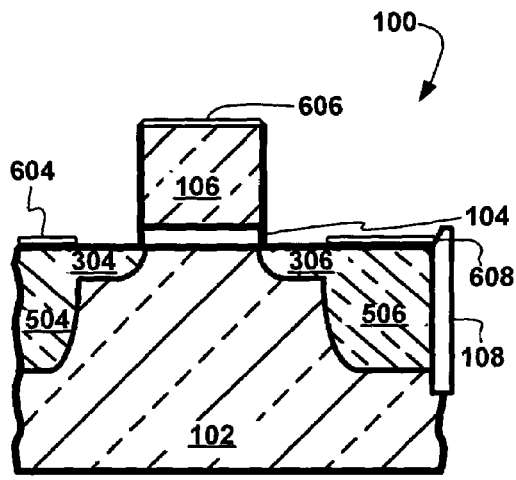
FIG. 7 is the structure of FIG. 6 after removal of the sidewall spacer.

Referring now to FIG. 7 therein is shown the structure of FIG. 6 after removal of the sidewall spacer 402. The sidewall spacer 402 is removed by etching, for example, if the sidewall spacer 402 is a nitride, it can be removed by etching with phosphoric acid, or other suitable etchant.

Figure 8:
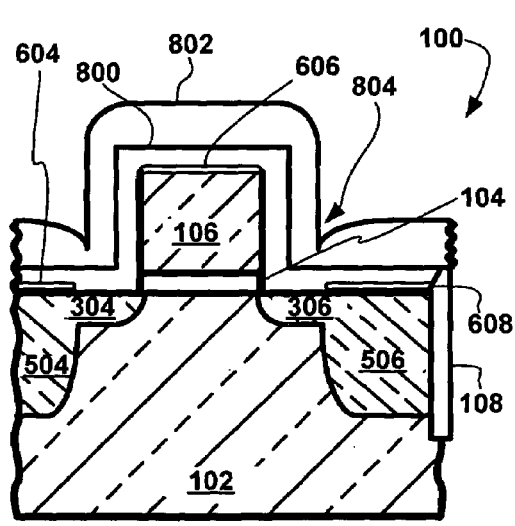
FIG. 8 is the structure of FIG. 7 after formation of an insulating liner and an insulating film.

Referring now to FIG. 8 therein is shown the structure of FIG. 7 after formation of an insulating liner 800 and an insulating film 802. The insulating liner 800, such as an oxide, is formed over the gate 106 and the surface of the semiconductor substrate 102, such as by deposition of an oxide. The insulating film 802, such as a nitride, is formed over the insulating liner 800. Preferably, the insulating film 802 is formed by plasma enhanced chemical vapor deposition (PECVD) to create a cusp 804 in the insulating film 802 at or near the transition of the insulating liner 800 from generally horizontal to generally vertical.

Figure 9:
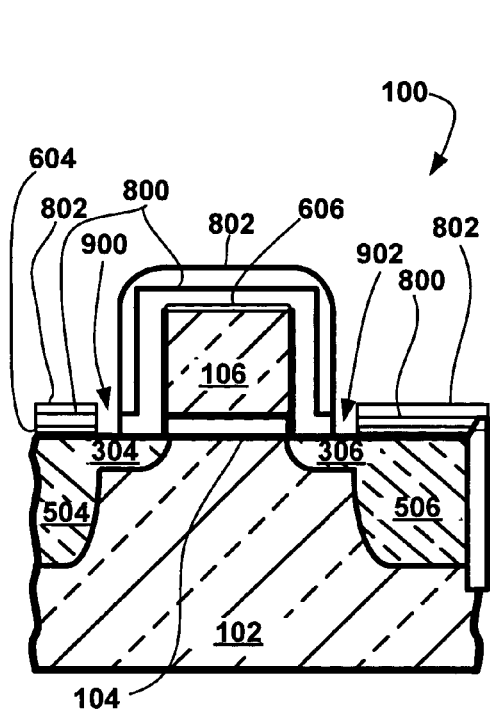
FIG. 9 is the structure of FIG. 8 after etching of the insulating liner and the insulating film.

Referring now to FIG. 9 therein is shown the structure of FIG. 8 after etching of the insulating liner 800 and the insulating film 802. The etching is selective so that part of the horizontal portion of the insulating liner 800 is removed to expose a number of windows 900 and 902 over the source/drain junctions 304 and 306, respectively, but the insulating film 802 still covers other areas of the semiconductor substrate 102 and the area over and around the gate 106.

Figure 10:
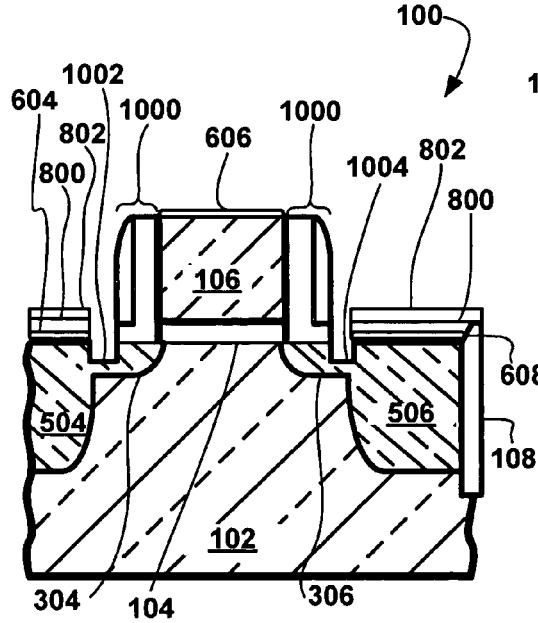
FIG. 10 is the structure of FIG. 9 after formation of a second sidewall spacer and a silicide trench.

Referring now to FIG. 10 therein is shown the structure of FIG. 9 after formation of a second sidewall spacer 1000 and a number of trenches 1002 and 1004. The second sidewall spacer 1000 is formed by etching the insulating film 802 further so it is substantially coplanar with the upper surface of the gate 106. The second sidewall spacer 1000 comprises a layer of the insulating liner 800 and a layer of the insulating film 802. This additional etching process also removes any remaining portion of the insulating film 802 from the windows 900 and 902.

The silicide 604 and 608 then is etched in the area of the windows 900 and 902. The semiconductor substrate 102 then is etched in the area of the windows 900 and 902 to form trenches 1002 and 1004 in the semiconductor substrate 102 at the outer edge of the second sidewall spacer 1000.

It has been discovered that the trenches 1002 and 1004 reduce or prevent lateral growth of the silicide 604 and 608 under the second sidewall spacer 1000 thereby reducing transistor leakage and the possibility of electrical short circuits due to lateral growth of the silicide 604 and 608.

It has been discovered that the cusp 804 shown in FIG. 8 facilitates subsequent trench formation as shown and described with reference to FIG. 10 below. The presence of the cusp 804 assists in the selective etching of the insulating film 802 in the area of the cusp 804. The selective etching of the insulating film 802 permits etching of the insulating liner 800 prior to complete removal of the insulating film 802 thereby allowing controlled etching to form the trenches 1002 and 1004 while protecting the unetched portion of the silicide 604 and 608 as well as the unetched portion of the source/drain junctions 504 and 506.

Figure 11:
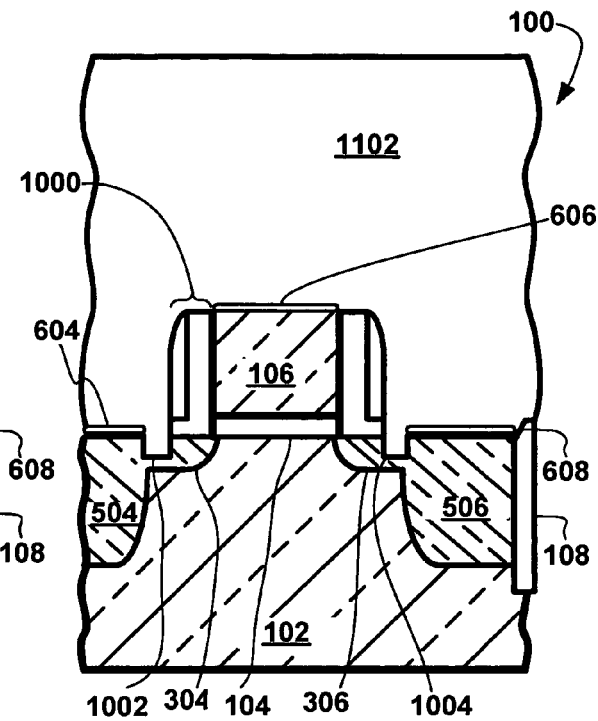
FIG. 11 is the structure of FIG. 10 after formation of a dielectric layer over the silicide, the second sidewall spacer, the silicide trench, and the shallow trench isolation.

Referring now to FIG. 11, therein is shown the structure of FIG. 10 after deposition of a dielectric layer 1102 over the silicide layers 604, 606, and 608, the second sidewall spacer 1000, and the STI 108.

In various embodiments, the dielectric layer 1102 is of dielectric materials such as silicon oxide ($SiO_x$), tetraethylorthosilicate (TEOS), borophosphosilicate (BPSG) glass, etc. with medium dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 12:
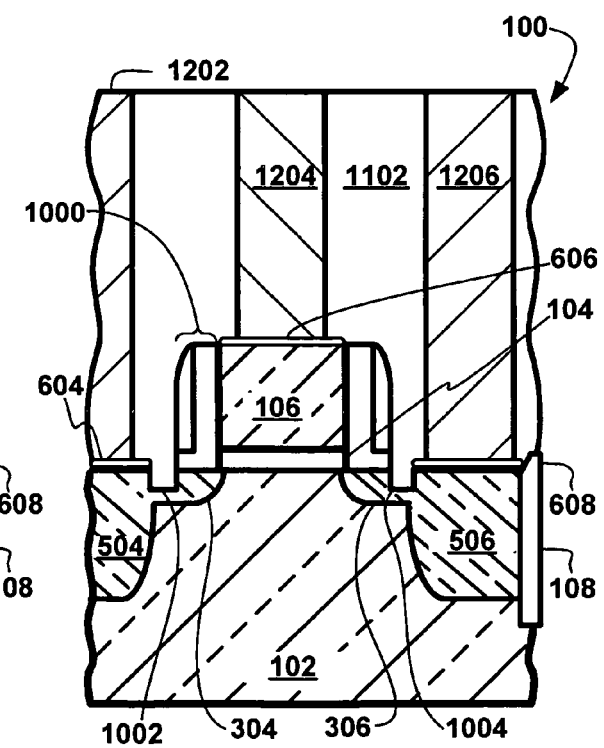
FIG. 12 is the structure of FIG. 11 after formation of metal contacts.

Referring now to FIG. 12, therein is shown the structure of FIG. 11 after formation of metal contacts 1202, 1204, and 1206.

The metal contacts 1202, 1204, and 1206 are respectively electrically connected to the silicide layers 604, 606, and 608, and respectively to the deep source/drain junction 504, the gate 106, and the deep source/drain junction 506.

In various embodiments, the metal contacts 1202, 1204, and 1206 are of metals such as tantalum (Ta), titanium (Ti), tungsten (W), alloys thereof, and compounds thereof. In other embodiments, the metal contacts 1202, 1204, and 1206 are of metals such as copper (Cu), gold (Au), silver (Ag), alloys thereof, and compounds thereof with one or more of the above elements with diffusion barriers around them.

Additionally and alternatively, the portions of the insulating liner 800 and the insulating film 802 shown in FIGS. 8 through 10 can be maintained over the source/drain junctions 504 and 506 to provide an etch stop stack during contact formation.

Referring now to FIG. 13, therein is shown a simplified flow chart of a method 1300 in accordance with the present invention. The method 1300 includes: providing a semiconductor substrate in a step 1302; forming a gate dielectric on the semiconductor substrate in a step 1304; forming a gate on the gate dielectric in a step 1306; forming source/drain junctions in the semiconductor substrate in a step 1308; forming a silicide on the source/drain regions and on the gate in a step 1310; forming trenches in the semiconductor substrate around the gate in a step 1312; depositing an interlayer dielectric above the semiconductor substrate in a step 1314; and forming contacts in the interlayer dielectric to the silicide in a step 1316.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. An integrated circuit comprising:
   a semiconductor substrate;
   a gate dielectric on the semiconductor substrate;
   a gate on the gate dielectric;
   source/drain junctions in the semiconductor substrate;
   a silicide on the source/drain junctions and on the gate;
   an insulating liner around the gate;
   an insulating film over the insulating liner;
   trenches in the semiconductor substrate at the outer edges of the insulating film;
   an interlayer dielectric above the semiconductor substrate; and
   contacts in the interlayer dielectric to the silicide.

2. The integrated circuit as claimed in claim 1 wherein:
   the trenches extend into the semiconductor substrate to a level lower than the silicide.

3. The integrated circuit as claimed in claim 1 wherein:
   the interlayer dielectric deposits a dielectric material having a dielectric constant selected from a group consisting of medium, low, and ultra-low dielectric constants.

4. The integrated circuit as claimed in claim 1 wherein:
   the contacts to the silicide comprise materials selected from a group consisting of tantalum, titanium, tungsten, copper, gold, silver, an alloy thereof, a compound thereof, and a combination thereof.

5. A method of forming an integrated circuit comprising:
   providing a semiconductor substrate;
   forming a gate dielectric on the semiconductor substrate;
   forming a gate on the gate dielectric;
   forming a sidewall spacer around the gate;
   forming a cusp at the outer edge of the sidewall spacer;
   removing the sidewall spacer at the cusp;
   forming source/drain junctions in the semiconductor substrate;
   forming a silicide on the source/drain junctions and on the gate;
   forming trenches in the semiconductor substrate at the outer edge of the sidewall spacer;
   forming an interlayer dielectric above the semiconductor substrate; and
   forming contacts in the interlayer dielectric to the silicide.

6. The method as claimed in claim 5 wherein:
   forming the trenches uses an etching process that etches the semiconductor substrate.

7. The method as claimed in claim 5 wherein:
   forming the interlayer dielectric deposits a dielectric material having a dielectric constant selected from a group consisting of medium, low, and ultra-low dielectric constants.

8. The method as claimed in claim 5 wherein:
   forming the contacts to the silicide uses materials selected from a group consisting of tantalum, titanium, tungsten, copper, gold, silver, an alloy thereof, a compound thereof, and a combination thereof.

* * * * *

UNITED STATES PATENT AND TRADEMARK OFFICE
CERTIFICATE OF CORRECTION

PATENT NO. : 7,023,059 B1
DATED : April 4, 2006
INVENTOR(S) : Chan et al.

It is certified that error appears in the above-identified patent and that said Letters Patent is hereby corrected as shown below:

Column 5,
Lines 28 and 31, delete "suicides" and insert -- silicides --.

Signed and Sealed this

Sixth Day of June, 2006

JON W. DUDAS
*Director of the United States Patent and Trademark Office*